US012721105B2

(12) United States Patent
Toda et al.

(10) Patent No.: US 12,721,105 B2
(45) Date of Patent: Aug. 25, 2026

(54) INTEGRATED DICING DIE BONDING SHEET AND METHOD FOR PRODUCING SEMICONDUCTOR DEVICE

(71) Applicant: DOW TORAY CO., LTD., Tokyo (JP)

(72) Inventors: Nohno Toda, Ichihara (JP); Eiji Kitaura, Ichihara (JP); Manabu Sutoh, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 479 days.

(21) Appl. No.: 18/268,220

(22) PCT Filed: Dec. 14, 2021

(86) PCT No.: PCT/JP2021/046121
§ 371 (c)(1),
(2) Date: Jun. 17, 2023

(87) PCT Pub. No.: WO2022/138341
PCT Pub. Date: Jun. 30, 2022

(65) Prior Publication Data

US 2024/0087941 A1 Mar. 14, 2024

(30) Foreign Application Priority Data

Dec. 25, 2020 (JP) ................................ 2020-216518

(51) Int. Cl.
*H10P 72/70* (2026.01)
*B81C 1/00* (2006.01)
(Continued)

(52) U.S. Cl.
CPC ...... *H10P 72/7402* (2026.01); *B81C 1/00904* (2013.01); *B81C 99/0025* (2013.01);
(Continued)

(58) Field of Classification Search
CPC ........ H01L 21/6836; H01L 2221/68327; C09J 7/35
See application file for complete search history.

(56) References Cited

U.S. PATENT DOCUMENTS

2007/0090299 A1 4/2007 Kozakai et al.
2007/0166500 A1 7/2007 Sutoh et al.
(Continued)

FOREIGN PATENT DOCUMENTS

JP 2000080335 A 3/2000
JP 2005183855 A 7/2005
(Continued)

OTHER PUBLICATIONS

English translation of International Search Report for PCT/JP2021/046121 dated Mar. 1, 2022, 3 pages.
(Continued)

*Primary Examiner* — Brian Turner
(74) *Attorney, Agent, or Firm* — Warner Norcross + Judd LLP

(57) ABSTRACT

Provided is an integrated dicing die bonding sheet having excellent storage stability and stress relaxation properties, having no problems such as chip flying, chipping, cracking, and the like during a dicing process, and having excellent production efficiency; and a method of manufacturing a semiconductor device (particularly including a MEMS device) using the same. An integrated dicing die bonding sheet including a base film, and a silicone-based adhesive sheet having an adhesive surface adhered to the semiconductor wafer, wherein at a stage after dicing the semiconductor wafer and prior to heating, the base film can be interfacially peeled from the silicone-based adhesive sheet, and after the adhesive surface is heated within a range of 50 to 200° C., a peeling mode of the adhesive surface from
(Continued)

another non-pressure-sensitive adhesive base material changes to cohesive failure, exhibiting permanent adhesion.

11 Claims, 1 Drawing Sheet

(51) Int. Cl.

| | |
|---|---|
| ***B81C 99/00*** | (2010.01) |
| ***C09J 7/35*** | (2018.01) |
| ***C09J 11/06*** | (2006.01) |
| ***C09J 183/10*** | (2006.01) |
| ***H10W 72/00*** | (2026.01) |
| ***H10W 72/30*** | (2026.01) |
| ***H10W 90/00*** | (2026.01) |

(52) U.S. Cl.

CPC ................. *C09J 7/35* (2018.01); *C09J 11/06* (2013.01); *C09J 183/10* (2013.01); *B81C 2203/032* (2013.01); *C09J 2483/00* (2013.01); *H10P 72/7416* (2026.01); *H10W 72/01336* (2026.01); *H10W 72/0198* (2026.01); *H10W 72/073* (2026.01); *H10W 72/07338* (2026.01); *H10W 72/354* (2026.01); *H10W 90/732* (2026.01); *H10W 90/734* (2026.01); *H10W 90/736* (2026.01)

(56) References Cited

U.S. PATENT DOCUMENTS

| | | | |
|---|---|---|---|
| 2007/0218299 A1 | 9/2007 | Azechi | |
| 2007/0224800 A1 | 9/2007 | Miyoshi | |
| 2011/0224344 A1 | 9/2011 | Fujisawa et al. | |
| 2012/0058625 A1* | 3/2012 | Amano | H01L 21/67132 438/464 |
| 2019/0053386 A1* | 2/2019 | Kawata | H05K 3/4697 |
| 2020/0071580 A1 | 3/2020 | Ogawa et al. | |
| 2020/0115603 A1 | 4/2020 | Yamazaki et al. | |
| 2020/0339848 A1 | 10/2020 | Toda et al. | |
| 2022/0169894 A1 | 6/2022 | Yamazaki | |

FOREIGN PATENT DOCUMENTS

| | | |
|---|---|---|
| JP | 2007138149 A | 6/2007 |
| JP | 2007191629 A | 8/2007 |
| JP | 2007246842 A | 9/2007 |
| JP | 2007258317 A | 10/2007 |
| JP | 2010050346 A | 3/2010 |
| JP | 2010070599 A | 4/2010 |
| JP | 2011086844 A | 4/2011 |
| JP | 2012169573 A | 9/2012 |
| JP | 2012182402 A | 9/2012 |
| JP | 2013062446 A | 4/2013 |
| JP | 2019087588 A | 6/2019 |
| JP | 2020070402 A | 5/2020 |
| JP | 2020132739 A | 8/2020 |
| JP | 2020189908 A | 11/2020 |
| WO | 2018159725 A1 | 9/2018 |
| WO | 2019003995 A1 | 1/2019 |
| WO | 2019124417 A1 | 6/2019 |
| WO | 2020203304 A1 | 10/2020 |

OTHER PUBLICATIONS

Machine assisted English translation of JP2010050346A obtained from https://worldwide.espacenet.com/patent on Jul. 27, 2023, 13 pages.

Machine assisted English translation of JP2013062446A obtained from https://worldwide.espacenet.com/patent on Jul. 27, 2023, 22 pages.

Machine assisted English translation of JP2012182402A obtained from https://worldwide.espacenet.com/patent on Jul. 27, 2023, 12 pages.

Machine assisted English translation of JP2012169573A obtained from https://worldwide.espacenet.com/patent on Jul. 27, 2023, 13 pages.

Machine assisted English translation of JP2000080335A obtained from https://worldwide.espacenet.com/patent on Jul. 27, 2023, 15 pages.

Machine assisted English translation of JP2020189908A obtained from https://worldwide.espacenet.com/patent on Jul. 27, 2023, 19 pages.

Machine assisted English translation of JP2020132739A obtained from https://worldwide.espacenet.com/patent on Jul. 27, 2023, 14 pages.

Machine assisted English translation of JP2020070402A obtained from https://worldwide.espacenet.com/patent on Jul. 27, 2023, 18 pages.

Machine assisted English translation of JP2019087588A obtained from https://worldwide.espacenet.com/patent on Jul. 27, 2023, 13 pages.

Machine assisted English translation of JP2007191629A obtained from https://worldwide.espacenet.com/patent on Jul. 27, 2023, 16 pages.

Machine assisted English translation of JP2011086844A obtained from https://worldwide.espacenet.com/patent on Jul. 27, 2023, 13 pages.

* cited by examiner

INTEGRATED DICING DIE BONDING SHEET AND METHOD FOR PRODUCING SEMICONDUCTOR DEVICE

CROSS-REFERENCE TO RELATED APPLICATIONS

This application is the U.S. National Stage of PCT/JP2021/046121 filed on 14 Dec. 2021, which claims priority to Japanese Patent Application No. 2020-216518 filed on 25 Dec. 2020, the content of which is incorporated herein by reference.

TECHNICAL FIELD

The present invention relates to: an integrated dicing die bonding sheet having excellent storage stability and stress relaxation properties and no problems such as chip flying, chipping, cracking, and the like during a dicing process, and in which a base film (=dicing tape) can be easily removed by interfacial peeling and a semiconductor wafer after dicing can be permanently adhered to the attachment part by post curing via an adhesive surface of a silicone adhesive sheet exposed after removal; and a method of manufacturing a semiconductor device (particularly including an MEMS device) using the same.

BACKGROUND ART

A semiconductor wafer of silicon or the like becomes a semiconductor device through a step of forming a plurality of electronic circuits on a surface thereof, a step of polishing a back surface of the semiconductor wafer on which the electronic circuits are formed, a step of cutting (dicing) the semiconductor wafer in a condition secured to a base film to divide the wafer into IC chips having individual electronic circuits, a step of securing (die bonding) the IC chips to a die pad, and a step of optionally resin sealing the chips. Herein, in the step of securing the IC chips obtained by cutting the semiconductor wafer to a die pad, the chips are secured to the die pad (mount part) via an adhesive. When the adhesive is in liquid form, the adhesive is dripped or applied to a surface of the chip mount part or the chip itself. However, it is difficult to accurately control the adhesive amount when dripping such a liquid adhesive, and thus the adhesive may stick out from the chip when the chip is small or be insufficient when the chip is large. Therefore, a method of securing IC chips to a die pad using a dry-type sheet adhesive of uniform thickness has been implemented.

On the other hand, in recent years, in the field of semiconductor devices, the use of micro electro mechanical systems (MEMS) technology has led to the widespread use of compact and highly integrated sensors and other MEMS devices, which, compared to conventional devices, have resulted in more compact semiconductor packages, and ultra-compact and lightweight semiconductor chips obtained by dicing, requiring high-precision structures with a large number of semiconductor chips in a package. For such ultra-compact semiconductor chips, in order to improve the production efficiency thereof, there is a growing demand for an integrated dicing die bonding sheet having a structure in which a base film (dicing tape) used for dicing and a sheet adhesive are integrated together, and for example, Patent Documents 1 to 3 propose integrated dicing die bonding sheets. However, these sheets are not specifically disclosed as being an integrated dicing die bonding sheet with a specific addition-reaction type silicone adhesive sheet. Furthermore, none of the documents suggest a silicone adhesive sheet that easily peels from a dicing tape, having excellent storage stability and in which stress relaxation properties are maintained while maintaining the thickness of the silicone adhesive sheet itself.

In contrast, in Patent Document 4, the present applicant has proposed a dicing die bonding sheet having a structure in which a base film, which is a dicing tape, and a silicone adhesive layer provided by an addition reaction are bonded through a peelable base layer. However, without a peelable base layer, the dicing tape and silicone adhesive layer of the sheet adhere firmly to each other, and the two cannot be peeled off after dicing. The base layer impairs the stress relaxation properties of the silicone adhesive layer. Therefore, if a base layer must be used, there tends to be chip flying, chipping, cracking, and the like during a dicing process, making it insufficiently suitable for use in the manufacture of compact semiconductor devices, including MEMS devices, and thus production efficiency and yield thereof cannot be improved.

In addition, Patent Documents 5 and 6 propose dicing die bonding sheets having a structure in which a silicone adhesive layer that cures by an addition reaction is adhered with a different type of silicone adhesive layer. However, conversely, the silicone adhesive layer can only be peeled off in combination with a specific silicone pressure-sensitive adhesive layer, and when an acrylic PSA or the like, which is commonly used in dicing tape, is adhered therewith, the two firmly integrate. Thus, a function required for storage stability and an integrated dicing die bonding sheet cannot be achieved. In addition, the silicone adhesive layer does not achieve sufficient stress relaxation properties with regard to semiconductor chips and the like during dicing while maintaining thickness. In particular, there is a problem where the thickness of the silicone adhesive layer tends to change during curing for the purpose of permanent adhesion, making it insufficiently suitable for use in the manufacture of compact semiconductor devices including MEMS devices; thus, production efficiency and yield cannot be improved.

Furthermore, when a conventional silicone-based adhesive sheet is used in an ultra-compact MEMS device, vibration that occurs during a die bonding process after a semiconductor chip having an adhesive sheet layer is arranged on a die pad may cause misalignment of the semiconductor chip on the die pad. In particular, in MEMS devices, a large number of semiconductor chips are sequentially placed in the same package; therefore, it is difficult to completely suppress such vibrations, which requires checking and readjusting the arrangement of the chips after arrangement, and the like, resulting in lower yield and production efficiency.

The problem of misalignment caused by vibration can be solved by permanently adhering (=securing by thermal pressure bonding) individual chips provided with an adhesive sheet in sequence by thermal pressure bonding (press heating) or the like. However, this process requires at least several seconds of a thermal pressure bonding operation for each chip, which significantly reduces production efficiency in MEMS devices provided with a large number of semiconductor chips, and the pressure bonding operation may cause damage to the device itself. In addition, it may become difficult to remove a semiconductor chip that has been secured once, which may deteriorate the reusability and repairability of the device. Therefore, integrated dicing die bonding sheets using a known silicone-based adhesive sheet has limited industrial use, particularly in the manufacture of MEMS devices.

PRIOR ART DOCUMENTS

Patent Documents

Patent Document 1: Japanese Unexamined Patent Application 2007-138149
Patent Document 2: Japanese Unexamined Patent Application 2010-050346
Patent Document 3: Japanese Unexamined Patent Application 2013-062446
Patent Document 4: Japanese Unexamined Patent Application 2005-183855
Patent Document 5: Japanese Unexamined Patent Application 2012-182402
Patent Document 6: Japanese Unexamined Patent Application 2012-169573
Patent Document 7: WO 2019/124417

SUMMARY OF THE INVENTION

Problem to be Solved by the Invention

An object of the present invention is to provide: an integrated dicing die bonding sheet suitable for use in the manufacture of compact semiconductor devices including MEMS devices, and particularly a dicing process for ultra-compact/lightweight semiconductor chips and a mounting and adhering process of individualized semiconductor chips for a high precision structure on which a large number of semiconductor chips are arranged in a compact package, having excellent storage stability and stress relaxation properties and no problems with chip flying, chipping, cracking, and the like during a dicing process, and in which a base film (=dicing tape) and silicone adhesive sheet are laminated, the base film can be easily removed by interfacial peeling, and a semiconductor wafer after dicing can be permanently adhered to an attachment part by post curing via an adhesive surface of a silicone adhesive sheet exposed after the removal; and a method of manufacturing a semiconductor device (particularly including MEMS devices) using the same. In particular, an object is to improve the production efficiency and yield of compact semiconductor devices including MEMS device using the integrated dicing die bonding sheet described above.

Means for Solving the Problem

As a result of extensive studies, the present inventors discovered that the aforementioned problem can be solved by an integrated dicing die bonding sheet having a laminated structure in which the base film (=dicing tape) and the silicone adhesive sheet, whose surface is a moderately slightly pressure-sensitive adhesive, are directly adhered to each other without using a base layer, wherein the two can be interfacially peeled at a stage prior to heating to 50° C. or higher, and after the adhesive surface of the silicone-based adhesive sheet is heated within a range of 50 to 200° C., a peeling mode of the adhesive surface from another non-pressure-sensitive adhesive base material changes to cohesive failure, exhibiting permanent adhesion, thereby arriving at the present invention.

Specifically, a problem of the present invention is solved by an integrated dicing die bonding sheet adhered to a semiconductor wafer prior to dicing the semiconductor wafer, including a base film, and a silicone-based adhesive sheet having an adhesive surface adhered to the semiconductor wafer, wherein at a stage after dicing the semiconductor wafer and prior to heating to 50° C. or higher, the base film can be interfacially peeled from the silicone-based adhesive sheet, and after the adhesive surface of the silicone-based adhesive sheet is heated within a range of 50 to 200° C., a peeling mode of the adhesive surface from another non-pressure-sensitive adhesive base material changes to cohesive failure, exhibiting permanent adhesion.

Herein, the silicone-based adhesive sheet of the present invention is preferably a crosslinked product of a crosslinkable silicone composition cured using a hydrosilylation reaction catalyst, preferably containing at least one type of adhesion promoter (preferably, a specific adhesion promoter or a combination thereof) in a range of 0.1 to 5.0 parts by mass relative to 100 parts by mass of an organopolysiloxane having an alkenyl group as a main agent, with an SiH/Vi ratio thereof being in a range of 1.0 to 3.0, and an adhesive sheet surface thereof being slightly pressure-sensitive adhesive, thereby providing pressure-sensitive adhesive properties that allow interfacial peeling from a base film. This is because such a crosslinked product has substantially completed a crosslinking reaction and has low reactivity at room temperature, and therefore can be stored for a long period of time so long as it is not heated to 50° C. or higher, while still having favorable retention with regard to an adhesive surface of a dicing tape such as acrylic PSA or the like, still allowing interfacial peeling and in which an adhesive sheet surface thereof expresses permanent adhesion with regard to another non-pressure-sensitive adhesive base material upon heating. Furthermore, the silicone-based adhesive sheet as described above has moderate viscoelasticity, and therefore has particularly excellent stress relaxation for semiconductor chips during dicing and vibration during semiconductor stacking, and can suppress chip flying, chipping, cracking, and the like during a dicing process.

Furthermore, a problem of the present invention is solved by a method of manufacturing a semiconductor device (in particular, an MEMS device requiring compactness/miniaturization), wherein the integrated dicing die bonding sheet above is used, the manufacturing method including:

Step 1: a step of exposing the silicone-based adhesive sheet surface of the integrated dicing die bonding sheet described above on a side not adhered to a base film and then laminating to a rear surface of a semiconductor wafer;

Step 2: a step of individualizing the laminate body obtained in step 1 above by dicing;

Step 3: a step of interfacially peeling the base film from an individual piece of the semiconductor wafer obtained in step 2 above to expose the silicone-based adhesive sheet surface on the base film side;

Step 4: a step of arranging the individualized semiconductor wafer on a semiconductor base material via the silicone-based adhesive sheet surface exposed in step 3; and Step 5: a step of heating the structure with the individual piece of the semiconductor wafer arranged on the semiconductor base material by the silicone-based adhesive sheet surface, which was obtained in step 4, within a range of 50 to 200° C. to adhere the individual piece of the semiconductor wafer on the semiconductor base material by the silicone-based adhesive sheet.

Effects of the Invention

The present invention can provide: an integrated dicing die bonding sheet suitable for use in the manufacture of compact semiconductor devices including MEMS devices, having excellent storage stability and stress relaxation properties of an adhesive sheet itself due to a base film (=dicing tape) and a silicone adhesive sheet surface maintaining interfacial releasability in addition to retention and tight adhesion properties at room temperature, and in which the base film can be easily removed from the silicone adhesive sheet surface by interfacially peeling before heating and a semiconductor wafer after dicing can be permanently adhered to an attachment part by post curing via an adhesive surface of a silicone adhesive sheet exposed after the removal; and a method of manufacturing a semiconductor device (particularly including MEMS devices) using the same.

The silicone adhesive sheet according to the present invention is provided in a condition in which a crosslinking reaction is substantially complete, and therefore has excellent preservation properties in that interfacial releasability is maintained between a base film and am acrylic PSA layer thereof even when the two are in contact with each other under room temperature. Moreover, the silicone adhesive sheet has no problems with chip flying, chipping, cracking, or the like during a dicing process, and has excellent adhesion after peeling from a dicing tape and excellent stability of the thickness of an adhesive layer.

Note that the silicone-based adhesive sheet according to the present invention temporarily retains a semiconductor chip or the like against vibration or the like, and maintains slight pressure-sensitive adhesion that allows temporary securing to a base material without undergoing processes such as thermal pressure bonding and the like. Moreover, so long as the adhesive sheet is not heated to 50° C. or higher after the semiconductor chip is arranged, permanent adhesion such as cohesive failure and the like does not occur, and the chip can be rearranged by separating by interfacial peeling. Therefore, chips that have been individualized using the integrated dicing die bonding sheet according to the present invention, when arranged on a semiconductor base material, are less likely to have problems such as chip misalignment or detachment when subjected to vibration or the like, and enable chip rearrangement by interfacial peeling from the base material without adhesive residue as desired.

Therefore, the use of this manner of integrated dicing die bonding sheet including a silicone adhesive sheet can improve the production efficiency and yield of compact semiconductor devices including MEMS device.

MODE FOR CARRYING OUT THE INVENTION

Figure 1:
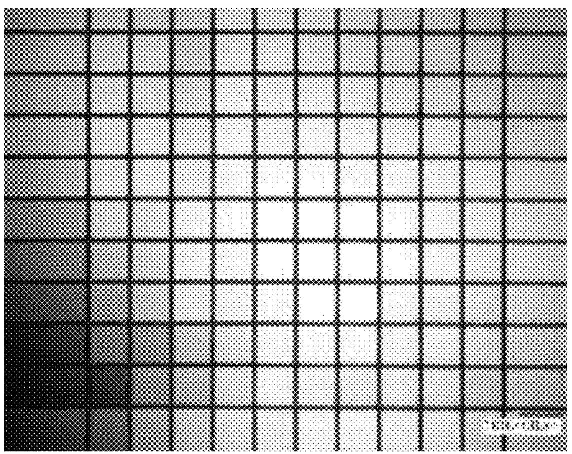
FIG. 1 is a photograph of a semiconductor wafer diced using an integrated dicing die bonding sheet of the Examples, observed from an upper surface.

The integrated dicing die bonding sheet according to the present invention includes a base film and a silicone-based adhesive sheet laminated on a surface thereof, and a peelable protective layer may be provided on the base film side and the silicone-based adhesive sheet side. In particular, the surface of the silicone-based adhesive sheet side is a slightly pressure-sensitive adhesive, and therefore is particularly preferably completely covered by a protective layer from the perspective of storage stability. Note that the surface of the silicone-based adhesive sheet of the integrated dicing die bonding sheet according to the present invention is slightly pressure-sensitive adhesive, can be easily interfacially peeled even after tight adhesion with an acrylic PSA layer or the like on the base film over a long period of time, and maximizes the stress relaxation properties of the sheet itself. Therefore, the integrated dicing die bonding sheet does not require a peelable base layer or the like to be provided between the base film and the silicone-based adhesive sheet and is a laminated structure that directly integrates the two.

The base film is used for so-called dicing tapes and preferably has elasticity in length and width directions of the film. Suitable examples include polyethylene films, polyvinyl chloride films, polybutene films, polybutadiene films, polyurethane films, polyester films, polyamide films, ethylene-vinyl acetate copolymer films, ethylene-(meth)acrylic acid copolymer films, ethylene-(meth)acrylic acid methyl copolymer films, ethylene-(meth)acrylic acid ethyl copolymer films, and other soft resin films. The base film may be made of a plurality of films laminated together. The thickness of the base film is not particularly limited, but is usually approximately 10 to 300 μm, and preferably approximately 50 to 200 μm.

A thin pressure-sensitive adhesive layer may be formed on a surface of the base film, and a customary acrylic, vinyl, polyurethane, silicone, or polyester pressure-sensitive adhesive may be used as the pressure-sensitive adhesive layer. Of these customary pressure-sensitive adhesives, acrylic pressure-sensitive adhesives are preferred in terms of pressure-sensitive adhesion. Furthermore, the aforementioned various pressure-sensitive adhesive layers on the base film may have properties in which the peel force thereof is changed, such as by irradiation with a high energy beam (e.g., ultraviolet light) or the like. The silicone-based adhesive sheet according to the present invention has substantially completed a crosslinking reaction and has low reactivity at room temperature; therefore, in a condition adhered to an acrylic pressure-sensitive adhesive layer or the like, can maintain favorable tight adhesion and interfacial releasability between the two, even after storage over a long period of time at room temperature. Thus, the sheet has excellent storage stability as an integrated dicing die bonding sheet as a whole.

The acrylic pressure-sensitive adhesive mainly contains an acrylic homo- or copolymer. The acrylic homopolymer is a homopolymer of acrylic acid or acrylic acid ester. The acrylic copolymer is usually a copolymer of an acrylic acid ester having a $C_1$-$C_{18}$ alkyl group in an ester moiety as a main monomer and, optionally, a copolymerizable sub-monomer having a hydroxyl group, a carboxyl group, an amino group, or other functional group. The molecular weight of the acrylic homo- or copolymer is not particularly limited, but the weight average molecular weight is $1.0\times10^5$ to $1.0\times10^6$, and particularly preferably $4.0\times10^5$ to $8.0\times10^5$. Furthermore, the pressure-sensitive adhesive strength and cohesive force can be controlled by adding a crosslinking agent to the pressure-sensitive adhesive containing an acrylic copolymer having the functional groups described above, as appropriate. Examples of such crosslinking agents include polyvalent isocyanate compounds, polyvalent epoxy compounds, polyvalent aziridine compounds, metal chelate compounds, and the like. Such acrylic pressure-sensitive adhesive may contain one or more types of acrylic homo- or copolymers and may further contain various additives.

When the pressure-sensitive adhesive layer above is formed on the surface of the base film, the base film and the silicone adhesive sheet can be more favorably integrated.

The thickness of the pressure-sensitive adhesive layer is preferably 1 to 50 μm, and particularly preferably 5 to 30 μm. Note that if the base film itself is made of a material that has favorable pressure-sensitive adhesion with the silicone adhesive sheet, or if the base film has a surface structure that provides favorable adhesion with the silicone adhesive sheet, the pressure-sensitive adhesive layer may be eliminated.

The silicone-based adhesive sheet according to the present invention is adhered to an adherend and then heated or the like to express permanent adhesion to the adherend. Herein, "permanent adhesion" refers to an adhesion state in which, when the silicone-based adhesive sheet or a cured product thereof (including post-cure cured products obtained by heating) is peeled off from the adherend, an adhesive layer where the peeling mode is the silicone-based adhesive sheet or cured product thereof causes cohesive failure on essentially an entire adhesive surface and remains on the adherend. Note that herein, "essentially an entire adhesive surface" means that cohesive failure occurs in at least a majority (50% or more) of the entire surface, and cohesive failure of the adhesive layer may occur in a so-called mottled pattern.

The silicone-based adhesive sheet of the present invention expresses permanent adhesion when heated in a range of 100 to 200° C. for 3 hours, but a temperature of 100° C. or lower or a heating time of 3 hours or less can be selected. Specifically, when the silicone-based adhesive sheet of the present invention is used in the manufacture of a semiconductor device, heating in a range of 50 to 200° C. or 50 to 150° C. is preferable. Furthermore, the heating time can be selected according to the size of the semiconductor device, scale of a heating device (oven, die attach press), or the like, but a range of several seconds to several hours is preferable for production efficiency. Furthermore, if desired, irradiation of a high energy beam such as ultraviolet light or the like may be used in combination for the purpose of adhesion in a short amount of time at a low temperature or reducing the adhesion time. Note that adhesion at a temperature of 200° C. or higher may cause operation failure, particularly in compact semiconductor devices such as MEMS and the like, and thus is not desirable as a condition for achieving permanent adhesion.

The silicone-based adhesive sheet according to the present invention has a sheet surface that is a moderately slightly pressure-sensitive adhesive at a stage before expressing permanent adhesion to the adherend by heating or the like as described above. Specifically, when arranged with respect to the adherend, the peeling mode is interfacial peeling, meaning that the adhesive layer itself is not destroyed upon peeling and the adhesive layer is essentially completely detached except for a small migrated component. The known silicone-based adhesive sheets disclosed in Patent Document 1 and the like are not slightly pressure-sensitive adhesive or the degree of the slight pressure-sensitive adhesion is insufficient or excessive, and are not particularly suitable for use in the manufacture of compact semiconductor devices including MEMS devices. In particular, if the silicone-based adhesive sheet is not slightly pressure-sensitive adhesive, it is difficult to position or re-arrange a semiconductor chip used in an MEMS device during arrangement or the like. In a semiconductor manufacturing process, after the arrangement process, which requires slight pressure-sensitive adhesion, the sheet can be permanently adhered by heating, which is an important feature of the silicone-based adhesive sheet of the present invention.

More specifically, for the silicone-based adhesive sheet according to the present invention, prior to heating, the peeling mode of the adhesive surface from another non-pressure-sensitive adhesive base material is interfacial peeling, and after heating the adhesive surface in the range of 50 to 200° C., the peeling mode of the adhesive surface from the other non-pressure-sensitive adhesive base material changes to cohesive failure, thereby exhibiting permanent adhesion. Note that "non-pressure-sensitive adhesive base material" herein refers to a base material that does not exhibit adhesion alone, such as semiconductor chips, semiconductor wafers, lead frames, resin substrates, ceramic substrates, laminated semiconductor chips, stainless steel sheets, and the like.

In other words, the silicone-based adhesive sheet according to the present invention has substantially completed a crosslinking reaction and has low reactivity at room temperature, and thus maintains slight pressure-sensitive adhesion and interfacial releasability with respect to the adherend without expressing permanent adhesion at 50° C. or lower, and particularly under room temperature. Therefore, with respect to the base film, the adhesive sheet can maintain favorable tight adhesion and interfacial releasability between the two, even after storage over a long period of time at room temperature, in a condition adhered to an acrylic pressure-sensitive adhesive layer such as an acrylic PSA layer or the like. Thus, the sheet has excellent storage stability as an integrated dicing die bonding sheet as a whole. Therefore, in the integrated dicing die bonding sheet according to the present invention, a structure for peeling off the base film after dicing, such as a base layer or the like, is unnecessary, and the stress relaxation properties of the silicone-based adhesive sheet described later can be expressed to the maximum extent.

A texture analyzer is used to lower a stainless steel probe with a diameter of 8 mm onto any surface of such a silicone adhesive sheet, and preferably a preheated silicone-based adhesive sheet at a rate of 0.01 mm/second with respect to the sheet surface, and apply a load of 50 gf, which was maintained for 0.5 seconds, and then, after raising the probe at a rate of 0.5 mm/second, the adhesive sheet was interfacially peeled from the probe; a maximum adhesive strength value thereof is exhibited, and when the surface exhibiting the maximum adhesive strength value is heated for three hours within a range of 100 to 200° C., the peeling mode from the other non-pressure-sensitive adhesive base material of the adhesive surface changes to cohesive failure, exhibiting permanent adhesion. Herein, the heating conditions described above are test conditions for confirming the presence or absence of permanent adhesion of the silicone adhesive sheet according to the present invention. A low temperature of 50 to 100° C. may be selected, and a heating time of less than 3 hours or more than 3 hours may be selected, for expressing actual permanent adhesion. These heating conditions can be selected as appropriate according to the type of the base material and the manufacturing conditions of a semiconductor and the like. Furthermore, the maximum adhesive strength value described above may be a value of 10 gf or more or 15 gf or more, and is preferably in a range of 10 gf to 500 gf or 50 gf to 400 gf. Note that any of the surfaces above may be single-sided or double-sided, and each surface may have a different maximum adhesive strength value or a different tensile distance indicating the maximum adhesive strength value. For the purposes of the present invention, the surface is preferably a surface on which a semiconductor chip or semiconductor wafer is adhered to an attachment part on a semiconductor base material. The adhesive surface is permanently adhered (die bonded) onto a semiconductor base material by subsequent heating or the like.

In particular, the present invention provides an integrated dicing die bonding sheet having light pressure-sensitive adhesive strength suitable in the manufacture of compact semiconductor devices including MEMS devices, and a silicone-based adhesive sheet meeting the conditions above can achieve an object of the present invention, regardless of the composition thereof. In other words, the texture analyzer is used to lower an 8 mm diameter stainless steel probe at a rate of 0.01 mm/second with respect to the sheet surface, and apply a load of 50 gf, which is maintained for 0.5 seconds, and then, after raising the probe at a rate of 0.5 mm/second, a silicone-based adhesive sheet having a maximum adhesive strength value is selected, which is suitable for temporary retention and temporary securing of a base material of a chip or the like, and enables die bonding of a semiconductor device without problems of misalignment and peeling due to vibration and the like. On the other hand, if a silicone-based adhesive sheet not having the maximum adhesive strength value in the test above is used, chips and the like may be displaced from a prescribed position or peeled off from the base material due to vibration or the like.

The method of achieving the slight pressure-sensitive adhesion and interfacial release properties described above for the silicone-based adhesive sheet according to the present invention is not limited, and can be solved by one or combining two or more means selected from: control of a main agent or crosslinking agent in a crosslinkable silicone composition forming the sheet; control of the crosslinking density (SiH/Vi ratio) of the composition; selection or addition of a silicone resin or other slight pressure-sensitive adhesion-imparting component in the composition; selection or addition of an adhesion imparting agent to the composition; chemical modification of a base material contact surface when curing the composition; and the like. In particular, it is a crosslinked product of the crosslinkable silicone composition cured using a hydrosilylation reaction catalyst described later, containing at least one adhesion promoter (preferably a specific adhesion promoter or a combination therewith) in a range of 0.1 to 5.0 parts by mass with respect to 100 parts by mass of an organopolysiloxane having an alkenyl group, serving as a main agent, and in which the SiH/Vi ratio thereof is within a range of 1.0 to 3.0, the adhesive sheet surface is a slightly pressure-sensitive adhesive, and pressure-sensitive adhesive properties allowing for interfacial peeling from the base film are provided.

The silicone-based adhesive sheet of the present invention is not particularly limited in a compositional surface or manufacturing method thereof, other than the expression of permanent adhesion and providing the slightly pressure-sensitive adhesive surface identified using a texture analyzer, but is preferably formed by a crosslinked product of the crosslinkable silicone composition.

The crosslinking degree of the crosslinked product forming the adhesive sheet is not limited, but from the perspective of controlling changes in thickness of the silicone-based adhesive sheet before and after heating in addition to interfacial release properties with respect to the base film, the crosslinking reaction is preferably substantially completed by crosslinking the crosslinkable silicone composition. If the crosslinking reaction is not sufficiently advanced, changes in thickness and the like after heating may occur.

The silicone-based adhesive sheet is preferably the slightly pressure-sensitive adhesive surface above (one or both sides), and the surface having the maximum adhesive strength value above preferably expresses permanent adhesion with respect to a contacting adherend by heating in the range of 50 to 200° C. The layer is preferably formed by the crosslinked product of the crosslinkable silicone composition. Herein, the internal structure thereof is not limited, and for example, may contain a silicone rubber sheet, a polyimide resin sheet, a polyester resin sheet, an epoxy resin sheet, or other organic resin support body, silica particles, glass particles, alumina particles, silicone rubber particles, or other inorganic filler, or silicone rubber particles, polyimide resin particles, polyester resin particles, epoxy resin particles, or other organic filler. The shape of such silicone-based adhesive sheet is not limited and the thickness thereof is not limited. However, for practical purposes, the thickness is preferably within a range of 1 to 5000 μm, particularly preferably within a range of 10 to 1000 μm, and may be within a range of 10 to 500 μm.

In particular, the silicone-based adhesive sheet of the present invention is preferably obtained by crosslinking the composition between base materials having releasability with respect to the crosslinked product of the crosslinkable silicone composition, and at least one of the base materials particularly preferably has an oxygen atom and/or a sulfur atom on a surface in contact with the composition.

The oxygen atom preferably is an atom forming a group selected from a group consisting of carbonyl groups, alkoxy groups, ester groups, and ether groups. Furthermore, the sulfur atom is preferably an atom forming a group selected from a group consisting of sulfone groups and thioether groups. The presence or absence of oxygen atoms and/or sulfur atoms, and particularly groups containing an oxygen atom and/or sulfur atom as a constituent atom, on a base material surface having releasability can be easily confirmed by, for example, elemental analysis, X-ray fluorescence analysis, X-ray microanalyzer analysis, infrared absorption analysis, ESCA analysis, and the like. Furthermore, the amount of such atoms or groups is not limited and is preferably sufficient to be detectable by the analytical methods described above.

Examples of base materials having such atoms or groups and having releasability include polyester resins, polyether resins, polyether ether ketone resins, epoxy resins, phenol resins, polyoxymethylene resins, polyamide resins, polyetherimide resins, polyethersulfone resins, and polyphenylene sulfide resins, having such atoms or groups in a constituent molecule. Furthermore, polyethylene resins, polypropylene resins, fluororesin resins, and the like not having such atoms or groups in a constituent molecule may be corona treated, glow treated, plasma treated, ozone treated, ultraviolet treated, or the like, or other physical and/or chemical treatments to introduce chemically bonded oxygen atoms and/or sulfur atoms or groups having such atoms as a constituent atom on a surface thereof. Furthermore, a base material may contain only these organic resins, or a composite material may contain these organic resins. Furthermore, the base material is preferably a base material with a large dielectric constant and/or refractive index with respect to the crosslinked product of the crosslinkable silicone composition.

The shape of these base materials is not limited, but a sheet-like base material is preferred because use is possible as a protective material for the silicone-based adhesive sheet as is. For example, the protective material can be peeled off when adhering to an adherend such as a semiconductor chip, a chip attachment part, or the like, which is preferable. Furthermore, after manufacturing the silicone-based adhesive sheet, replacement may be performed with another peelable base material. The peelable base material in this case is not limited.

For example, when the silicone-based adhesive sheet of the present invention is a crosslinked product of a cross-linkable silicone composition and the composition is cross-linked between base materials having releasability with respect to the crosslinked product, the obtained final product is a silicone-based adhesive sheet sandwiched between the base materials having releasability with respect to the sheet, and preferably, at least one of the base materials has an oxygen atom or sulfur atom on a contact surface with the sheet.

The protective layer is a protective film layer that is laminated to an outer surface of a silicone adhesive sheet and a base film layer of the integrated dicing die bonding sheet according to the present invention to protect both surfaces and maintain favorable adhesion to a semiconductor wafer or the like. The protective layer is preferably a peelable film due to the properties thereof.

In particular, in the present invention, the entire silicone adhesive sheet surface forming the integrated dicing die bonding sheet is preferably covered by a protective layer, and for the protective layer, it is convenient and preferable to use the base material having releasability used in the manufacture of the silicone adhesive sheet as is. Specifically, for a silicone adhesive sheet supported between two base materials having releasability, only the base material having releasability on one side of the silicone adhesive sheet can be removed to expose an adhesive surface of the silicone adhesive sheet, which can then be adhered to the base film to create an integrated dicing die bonding sheet including a base film/silicone adhesive sheet/protective layer (=base material having releasability).

[Crosslinkable Silicone Composition]

In the silicone-based adhesive sheet, a hydrosilylation-reactive crosslinkable silicone composition is preferably used. In particular, the hydrosilylation-reactive crosslinkable silicone composition preferably contains (A) an organopolysiloxane having at least two silicon atom-bonded alkenyl groups in one molecule, (B) at least two silicon atom-bonded hydrogen atoms in one molecule, (C) at least one adhesion promoter, and (D) a hydrosilylation reaction catalyst.

Component (A) is a main agent of the composition above and contains one or more types of an alkenyl group-containing organopolysiloxane. The molecular structure of such an alkenyl group-containing organopolysiloxane is not particularly limited, with examples thereof including straight-chain, branched, cyclic, three-dimensional network structures, and combinations thereof. Examples of silicon atom-bonded alkenyl groups in component (A) include: vinyl groups, allyl groups, butenyl groups, pentenyl groups, and hexenyl groups. Vinyl groups are particularly preferable. Examples of bonding positions of the alkenyl group include molecular chain terminals and/or molecular side chains. Furthermore, examples of groups bonded to a silicon atom other than the alkenyl group in component (A) include: methyl groups, ethyl groups, propyl groups, butyl groups, pentyl groups, hexyl groups, heptyl groups, and the like; aryl groups such as phenyl groups, tolyl groups, xylyl groups, naphthyl groups, and the like; aralkyl groups such as benzyl groups, phenethyl groups, and the like; and halogenated alkyl groups such as chloromethyl groups, 3-chloropropyl groups, and 3,3,3-trifluoropropyl groups, and the like and other substituted or unsubstituted monovalent hydrocarbon groups. Methyl groups and phenyl groups are particularly preferred. Furthermore, the resulting silicone-based adhesive sheet has excellent cold resistance, and the reliability of a semiconductor device prepared using the silicone-based adhesive sheet is further improved. Therefore, the amount of phenyl groups to organic groups bonded to a silicon atom in component (A) is preferably 1 mol % or more, more preferably within a range of 1 to 60 mol %, and particularly preferably within a range of 1 to 30%. Furthermore, the viscosity of component (A) is not limited, but the viscosity at 25° C. is preferably within a range of 100 to 1,000,000 mPa·s.

In particular, component (A) is a linear alkenyl group-containing organopolysiloxane, preferably containing alkenyl groups at least at both ends of the molecular chain, and may have alkenyl groups only at both ends of the molecular chain. While not particularly limited thereto, examples of such component (A) include: dimethylpolysiloxanes blocked with dimethylvinylsiloxy groups at both ends of a molecular chain; dimethylsiloxane/methylphenylsiloxane copolymers blocked with dimethylvinylsiloxy groups at both ends of a molecular chain; dimethylsiloxane/methylvinylsiloxane copolymers blocked with trimethylsiloxy groups at both ends of a molecular chain; dimethylsiloxane/methylvinylsiloxane/methylphenylsiloxane copolymers blocked with trimethylsiloxy groups at both ends of a molecular chain; dimethylsiloxane/methylvinylsiloxane copolymers blocked with silanol groups at both ends of a molecular chain; polymers in which a portion of methyl groups of these polymers are substituted with alkyl groups other than ethyl groups, propyl groups, and other methyl groups or 3,3,3-trifluoropropyl groups or other halogenated alkyl groups; polymers in which a portion of vinyl groups of these polymers are substituted with alkenyl groups other than allyl groups, butenyl groups, hexenyl groups, and other vinyl groups; and mixtures of two or more of these polymers. Note that regarding these alkenyl group-containing organopolysiloxanes, in terms of preventing contact failure and the like, low molecular weight siloxane oligomers (octamethyltetrasiloxane (D4) and decamethylpentasiloxane (D5)) are preferably reduced or eliminated.

Component (B) is a crosslinking agent of the present composition and is an organopolysiloxane having at least two silicon atom-bonded hydrogen atoms in one molecule. Examples of molecular structures of component (B) include straight chain, partially branched straight chain, branched chain, cyclic, and networked. Furthermore, examples of bonding positions of the hydrogen atom bonded to a silicon atom in component (B) include molecular chain terminals and/or molecular side chains. Furthermore, examples of groups bonded to silicon atoms other than hydrogen atoms in component (B) include substituted or unsubstituted monovalent hydrocarbon groups, and methyl groups and phenyl groups are particularly preferable. Furthermore, the viscosity of component (B) is not limited, but the viscosity at 25° C. is within a range of 1 to 1,000 mPa·s, and preferably 1 to 500 mPa·s. Furthermore, low molecular weight siloxane oligomers (octamethyltetrasiloxane (D4), decamethylpentasiloxane (D5)) may be reduced or eliminated from the perspective of preventing contact failure and the like.

Note that the structure of component (B) and the number of silicon atom-bonded hydrogen atoms in the molecule (average value) may be designed from the perspective of the flexibility of the cured product obtained by curing the composition of the present invention. For example, a linear organohydrogenpolysiloxane having at least two molecular chain side chains may be used as a chain length extender in terms of having excellent flexibility of the obtained organopolysiloxane cured product and excellent releasability from a member in addition to improving repair properties such as repair/reuse. In order to obtain a cured product with high hardness, a large number of silicon atom-bonded hydrogen atom organohydrogenpolysiloxanes may be used as cross-linking agents in the side chain and may be used in combination.

The blending amount of component (B) is an amount sufficient to crosslink component (A) above, and is preferably an amount at which the silicon atom-bonded hydrogen atoms in component (A) is within a range of 0.5 to 10 mols, and particularly preferably a range of 1 to 3 mols, relative to 1 mol of silicon atom-bonded alkenyl groups in the component. This is because, in the composition above, if the number of mols of silicon atom-bonded hydrogen atoms in component (A) is less than the range above relative to 1 mol of silicon atom-bonded alkenyl groups in the component, the composition tends not to crosslink, while if the number of mols exceeds the range above, the heat resistance of the crosslinked product obtained by crosslinking the composition tends to decrease.

Component (C) is a component that provides favorable adhesion to the crosslinked product of the composition described above and is preferably at least one type of adhesion promoter selected from a group consisting of: (i) siloxanes having at least one each of a silicon atom-bonded alkenyl group or a silicon atom-bonded hydrogen atom and a silicon atom-bonded alkoxy group in a molecule; (ii) organosiloxanes having at least one each of a silicon atom-bonded alkenyl group, a silicon atom-bonded alkoxy group, and a silicon atom-bonded epoxy-containing monovalent organic group in a molecule; (iii) mixtures or reaction mixtures of a silane or siloxane having at least one silicon atom-bonded alkoxy group in a molecule and an organosiloxane having at least one each of a silicon atom-bonded hydroxy group and a silicon atom-bonded alkenyl group in a molecule; and (iv) mixtures or reaction mixtures of an organosilane or organosiloxane having at least one each of a silicon atom-bonded alkoxy group and a silicon atom-bonded epoxy group-containing monovalent organic group in a molecule and an organosiloxane having at least one each of a silicon atom-bonded hydroxy group and a silicon atom-bonded alkenyl group in a molecule.

Of components (C), examples of molecular structures of the siloxane having in one molecule at least one each of a silicon atom-bonded alkenyl group or a silicon atom-bonded hydrogen atom and a silicon atom-bonded alkoxy group include: straight chain, partially branched straight chain, branched chain, cyclic, and networked. Straight chain, branched chain, and networked are particularly preferable. Examples of silicon atom-bonded alkenyl groups in the siloxane include: vinyl groups, allyl groups, butenyl groups, pentenyl groups, and hexenyl groups. Vinyl groups are particularly preferable. Furthermore, examples of the silicon atom-bonded alkoxy groups in the siloxane include: methoxy groups, ethoxy groups, propoxy groups, butoxy groups, and methoxyethoxy groups. Methoxy groups are particularly preferable. Furthermore, examples of silicon atom-bonded groups other than alkenyl groups, hydrogen atoms, and alkoxy groups in this siloxane include: alkyl groups such as methyl groups, ethyl groups, propyl groups, butyl groups, pentyl groups, hexyl groups, heptyl groups, and the like; aryl groups such as phenyl groups, tolyl groups, xylyl groups, naphthyl groups, and the like; aralkyl groups such as benzyl groups, phenethyl groups, and the like; halogenated alkyl groups such as chloromethyl groups, 3-chloropropyl groups, 3,3,3-trifluoropropyl groups, and the like and other substituted or unsubstituted monovalent hydrocarbon groups; glycydoxyalkyl groups such as 3-glycidoxypropyl groups, 4-glycidoxybutyl groups, and the like; (3,4-epoxycyclohexyl) alkyl groups such as 2-(3,4-epoxycyclohexyl) ethyl groups, 3-(3,4-epoxycyclohexyl) propyl groups, and the like; and oxylanyl alkyl groups such as 4-oxylanylbutyl groups, 8-oxylanyloctyl groups, and the like; and other epoxy-containing monovalent organic groups. Favorable adhesion can be provided on various types of base materials; therefore, at least one of the epoxy-containing monovalent organic groups is preferably included in a molecule. The viscosity of such a siloxane is not limited, but is preferably within a range of 1 to 500 mPa·s at 25° C.

Furthermore, of the components (C), with regard to the mixture of silanes or siloxanes with at least one silicon atom-bonded alkoxy group and organosiloxanes having at least one each of a silicon atom-bonded hydroxy group and silicon atom-bonded alkenyl group in a molecule, examples of the alkoxy groups bonded to silicon atoms in the former, or silanes, include: methoxy groups, ethoxy groups, propoxy groups, butoxy groups, and methoxyethoxy groups. Methoxy groups are particularly preferable. Furthermore, in addition to the alkoxy groups described above, the silicon atoms of the silanes may have an epoxy-containing monovalent organic group such as an alkyl group; an alkenyl group; an aryl group; an aralkyl group; a halogenated alkyl group or other substituted or unsubstituted monovalent hydrocarbon group; a 3-glycidoxypropyl group, a 4-glycidoxybutyl group, or other glycidoxyalkyl group; a 2-(3,4-epoxycyclohexyl)ethyl group, a 3-(3,4-epoxycyclohexyl) propyl group, or other (3,4-epoxycyclohexyl)alkyl group; or a 4-oxiranylbutyl group, a 8-oxiranyloctyl group, or other oxiranylalkyl group, and from the perspective of providing favorable adhesion to various base materials, at least one of the epoxy-containing monovalent organic groups is preferably included in one molecule.

Furthermore, examples of the molecular structure of the former, or siloxanes, include: straight chain, partially branched straight chain, branched chain, cyclic, and networked. Straight chain, branched chain, and networked are particularly preferable. The alkoxy group bonded to the silicon atom in the siloxane is preferably a methoxy group. Furthermore, in addition to the alkoxy groups described above, the silicon atoms of the siloxanes may have an epoxy-containing monovalent organic group such as an alkyl group; an alkenyl group; an aryl group; an aralkyl group; a halogenated alkyl group or other substituted or unsubstituted monovalent hydrocarbon group; a 3-glycidoxypropyl group, a 4-glycidoxybutyl group, or other glycidoxyalkyl group; a 2-(3,4-epoxycyclohexyl)ethyl group, a 3-(3,4-epoxycyclohexyl)propyl group, or other (3,4-epoxycyclohexyl)alkyl group; or a 4-oxiranylbutyl group, a 8-oxiranyloctyl group, or other oxiranylalkyl group, and from the perspective of providing favorable adhesion to various base materials, at least one of the epoxy-containing monovalent organic groups is preferably included in one molecule. The viscosity of such a siloxane is not limited, but is preferably within a range of 1 to 500 mPa·s at 25° C.

Furthermore, examples of the molecular structure of the latter, or organosiloxane, include: straight chain, partially branched straight chain, branched chain, cyclic, and networked. Straight chain, branched chain, and networked are particularly preferable. Examples of alkenyl groups bonded to silicon atoms in the organosiloxane include: vinyl groups, allyl groups, butenyl groups, pentenyl groups, and hexenyl groups. Vinyl groups are particularly preferable. Furthermore, examples of groups bonded to a silicon atom other than hydroxy groups and alkenyl groups in the organosiloxane include: alkyl groups; aryl groups; aralkyl groups; halogenated alkyl groups; and other substituted or unsubstituted monovalent hydrocarbon groups. The viscosity of such organosiloxanes is not limited, but is preferably within a range of 1 to 500 mPa·s at 25° C.

Although not limited, the ratio of silanes or siloxanes having at least one silicon atom-bonded alkoxy group to organosiloxanes having at least one each of a silicon atom-bonded hydroxy group and silicon atom-bonded alkenyl group in a molecule is such that particularly favorable adhesion can be provided. Therefore, the weight ratio of the former silane or siloxane to the latter organosiloxane is preferably within a range of 1/99 to 99/1.

A reaction mixture of alkoxysilane having an amino group-containing organic group and alkoxysilane having an epoxy group-containing organic group can be used as the adhesion imparting agent of the present invention, and the reaction ratio is preferably, in terms of molar ratio, within a range of (1:1.5) to (1:5), and particularly preferably within a range of (1:2) to (1:4). This component can be easily synthesized by mixing an alkoxysilane having an amino group-containing organic group and alkoxysilane having an epoxy group-containing organic group as described above to cause a reaction at room temperature or by heating.

In particular, when an alkoxysilane having an amino group containing organic group is reacted with an alkoxysilane having an epoxy group containing organic group by the method described in JP 10-195085 A, the present invention particularly preferably contains a carbasilatrane derivative obtained by cyclizing and represented by the general formula:

[Formula 1]

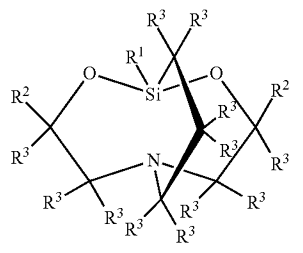

{wherein, $R^1$ is an alkyl group or an alkoxy group, and $R^2$ is the same or different group selected from the group consisting of groups represented by the general formula:

[Formula 2]

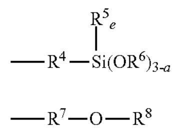

(wherein, $R^4$ is an alkylene group or alkyleneoxyalkylene group, $R^5$ is a monovalent hydrocarbon group, $R^6$ is an alkyl group, $R^7$ is an alkylene group, $R^8$ is an alkyl group, alkenyl group, or acyl group, and a is 0, 1, or 2.)
$R^3$ is the same or different hydrogen atom or alkyl group.}
Exemplary carbasilatrane derivatives may include a silatrane derivative having an alkenyl group and silicon atom-bonded alkoxy group per one molecule represented by the following structure.

[Formula 3]

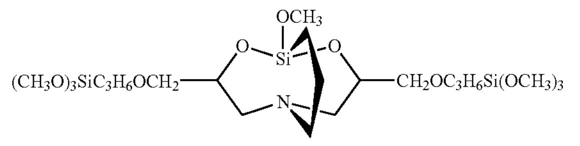

The component is an organic compound having at least two alkoxysilyl groups in a molecule, in addition to containing bonds other than a silicon-oxygen bond between these silyl groups, and serves to independently improve initial adhesion and improve the adhesive durability of a cured product including this adhesion promoter under harsh conditions particularly when used in combination with another adhesion imparting agent.

The blending amount of component (C) is an amount sufficient to provide favorable adhesion to a crosslinked product of the composition described above and, for example, is preferably within a range of 0.01 to 20 parts by weight, and particularly preferably within a range of 0.1 to 10 parts by weight, with respect to 100 parts by weight of component (A). This is because if the blending amount of component (C) is less than this range, adhesive properties of the cured product tend to decrease, while if the amount exceeds this range, the adhesive properties are not affected, but rather the stability of a silicone-based adhesive sheet tends to decrease.

Component (D) is a catalyst for promoting curing of the composition by a hydrosilylation reaction. Examples include platinum-based catalysts, rhodium-based catalysts, and palladium-based catalysts, and a platinum-based catalyst is preferred due to being able to significantly promote curing of the present composition. In particular, 1,3-divinyl-1,1,3,3-tetramethyldisiloxane is preferable because the platinum-alkenyl siloxane complex has good stability. In addition, in terms of improving the handleability as well as the pot life of the composition, a platinum containing hydrosilylation reaction catalyst in microparticles dispersed and encapsulated with thermoplastic resin may be used. Note that as the catalyst for promoting the hydrosilylation reaction, a non-platinum based metal catalyst such as iron, ruthenium, iron/cobalt, or the like may be used.

The blending amount of component (D) is sufficient to promote curing of the composition, and if a platinum-based catalyst is used, the amount of platinum metal atoms in the composition is preferably within a range of 0.01 to 500 ppm, 0.01 to 100 ppm, or 0.01 to 50 ppm in mass units. If the blending amount of component (D) is less than this range, the curing rate of a resulting composition tends to be significantly reduced. On the other hand, even if the amount exceeds this range, the curing rate is not affected much, but rather problems such as coloring and the like occur.

The composition above is obtained by uniformly mixing components (A) through (D), and the composition can be subjected to a hydrosilylation reaction by heating to room temperature or a temperature range of room temperature to 200° C., and preferably a temperature range of room temperature to 150° C. to form the silicone-based adhesive sheet of the present invention, which is a crosslinked product of the crosslinkable silicone composition. When heating the composition, care should be taken to ensure that the composition does not completely adhere to the base material, making peeling impossible.

In order to adjust the hydrosilylation reaction rate of the composition and to improve the stability of a semi-cured or fully cured product, a hydrosilylation reaction inhibitor is preferably added to the composition. 3-methyl-1-butyn-3-ol, 3,5-dimethyl-1-hexyne-3-ol, 3-phenyl-1-butyne-3-ol, and other acetylenic compounds, 3-methyl-3-pentene-1-yne, 3,5-dimethyl-3-hexene-1-yne, and other enyne compounds, 1,3,5,7-tetramethyl-1,3,5,7-tetravinylcyclotetrasiloxane, 1,3,5,7-tetramethyl-1,3,5,7-tetrahexenylcyclotetrasiloxane, and other cycloalkenylsiloxanes, benzotriazole and other triazole compounds, and the like can be particularly used without any limitation as the hydrosilylation reaction inhibitor in order to improve the handling workability of silicone compositions. The blending amount thereof depends on the curing conditions of the composition, but for practical use, is preferably within a range of 0.00001 to 5 parts by weight relative to 100 parts by weight of component (A).

Furthermore, the crosslinkable silicone composition as described above may also contain, as another optional component: precipitated silica, fumed silica, calcined silica, titanium dioxide, alumina, glass, quartz, aluminosilicate, iron oxide, zinc oxide, calcium carbonate, carbon black, silicon carbide, silicon nitride, boron nitride, or other inorganic filler; an inorganic filler treated with an organosilicone compound such as organohalosilane, organoalkoxysilane, organosilazane, or the like; a silicone resin, epoxy resin, fluororesin, or other an organic resin fine powder; silver, copper, or other conductive metal powder; and dyes, pigments, flame retardants, solvents, and the like. Furthermore, a curable epoxy resin, curable epoxy-modified silicone resin, curable silicone-modified epoxy resin, curable polyimide resin, curable polyimide-modified silicone resin, curable silicone-modified polyimide resin, or the like can be added so long as the purpose of the present invention is not impaired.

[Manufacturing Method of Silicone-Based Adhesive Sheet]

The silicone-based adhesive sheet described above can be manufactured, for example, by a method of crosslinking the composition between base materials having releasability with respect to the crosslinked product of the crosslinkable silicone composition, in which at least one of the base materials has an oxygen atom and/or a sulfur atom on a surface in contact with the composition. The oxygen atom and/or sulfur atom are the same as described above.

In the manufacturing method, examples of manufacturing the silicone-based adhesive sheet include: methods of crosslinking a crosslinkable silicone composition in a condition sandwiched between the aforementioned base materials; methods of uniformly applying the composition to both sides of a silicone rubber sheet, organic resin sheet, or other support body, and then crosslinking in a condition sandwiched between these base materials; and methods of crosslinking the composition containing silicone rubber particles, organic resin particles, inorganic particles, or other fillers, in a condition sandwiched between the base materials above. In order to prepare the silicone-based adhesive sheet sandwiched between these base materials, the crosslinkable silicone composition is preferably crosslinked after or while forming the sheet with two rollers, a press machine, or the like.

[Application]

The integrated dicing die bonding sheet according to the present invention is preferably provided with the aforementioned configuration and used for the purpose of dicing a semiconductor chip or semiconductor wafer for semiconductors and adhering individualized semiconductor chips to an attachment part thereof, and is particularly preferably used in the manufacture of an MEMS device. Herein, "MEMS device" is a generic term for a semiconductor device formed using semiconductor microfabrication technology, commonly called Micro Electro Mechanical Systems, and may be an inertial sensor such as an acceleration sensor, angular rate sensor, or the like provided with an MEMS chip. Furthermore, a known semiconductor device can be used without particular limitation, and examples include diodes, transistors, thyristors, monolithic ICs, hybrid ICs, LSIs, and VLSIs. The integrated dicing die bonding sheet according to the present invention can be suitably used in applications of temporarily securing a semiconductor chip of these semiconductor devices (including MEMS devices) to a chip attachment part after individualizing the semiconductor wafer by dicing, and then permanently adhering the pieces by heating or the like.

[Semiconductor Device Manufacturing Method]

The integrated dicing die bonding sheet of the present invention is suitable in the manufacture of semiconductor devices (suitably, MEMS devices), and is used in a method of manufacturing a semiconductor device, having the following steps:

Step 1: a step of exposing the silicone-based adhesive sheet surface of the integrated dicing die bonding sheet described according to the present invention on a side not adhered to a base film and then laminating to a rear surface of a semiconductor wafer;

Step 2: a step of individualizing the laminate body obtained in step 1 above by dicing;

Step 3: a step of interfacially peeling the base film from an individual piece of the semiconductor wafer obtained in step 2 above to expose the silicone-based adhesive sheet surface on the base film side;

Step 4: a step of arranging the individualized semiconductor wafer on a semiconductor base material via the silicone-based adhesive sheet surface exposed in step 3; and Step 5: a step of heating the structure with the individual piece of the semiconductor wafer arranged on the semiconductor base material by the silicone-based adhesive sheet surface, which was obtained in step 4, within a range of 50 to 200° C. to adhere the individual piece of the semiconductor wafer on the semiconductor base material by the silicone-based adhesive sheet.

Step 1 above is a step of laminating the silicone-based adhesive sheet described above to a rear surface of a semiconductor wafer, and a step of preparing a semiconductor wafer provided with the silicone-based adhesive sheet closely adhered to a base film on at least one side by means of pressure bonding or arranging on a slightly pressure-sensitive adhesive surface or the like. Note that in this case, an electrode or protective film may be formed on the wafer in advance if desired. Furthermore, an excess of the sheet may be cut off after the silicone-based adhesive sheet is adhered. Furthermore, heating may also be performed to improve the adhesive strength between the rear surface of the wafer and the silicone-based adhesive sheet.

Step 2 above is a so-called dicing step, and is a step of making individual pieces (dies) of the semiconductor wafer provided with the silicone-based adhesive sheet closely adhered to the base film on at least one side into semiconductor chips. In the creation of an MEMS device, a semiconductor chip with a length and width of 10 mm or less, and preferably 5 mm or less, may be and is preferably created. In this step, the semiconductor wafer including the base film, which is a dicing tape, is diced and individualized through the silicone-based adhesive sheet with excellent stress relaxation properties as described above, which has an advantage in which problems such as chip flying, chipping, cracking, and the like during the dicing process are unlikely to occur. On the other hand, after the dicing process, an attachment surface side to a semiconductor base material of the silicone-based adhesive sheet adhered onto the individualized semiconductor chips is covered by the base film.

Step 3 above is a step of removing the base film (=dicing tape) to expose the silicone-based adhesive sheet surface serving as the attachment surface to the semiconductor base material, which is one of the advantages of the integrated dicing die bonding sheet of the present invention. As described above, in the integrated dicing die bonding sheet according to the present invention, the base film can be easily interfacially peeled off from the silicone-based adhesive sheet surface so long as it is not heated to 50° C. or higher, and the silicone-based adhesive sheet surface on the base film side of the silicone-based adhesive sheet laminated on the semiconductor chip can be exposed to form the attachment surface on the semiconductor base material, without impairing attachment performance to the semiconductor base material.

Step 4 above is a so-called mounting step, and is a step in which the semiconductor chips (dies) that have been individualized by dicing are arranged on a circuit board such as a die pad or the like via the silicone-based adhesive sheet described above to create a temporarily retained (temporarily secured) semiconductor precursor. Note that after the step, the semiconductor chip may be treated by sputtering, wiring with an electrode, or the like.

The semiconductor precursor obtained by the step may be a precursor of a semiconductor device having a structure in which semiconductor chips (die) individualized by dicing are arranged on a circuit board such as a die pad or the like via the silicone-based adhesive sheet described above and temporarily retained (temporarily secured), and in particular, may be a precursor of a MEMS device.

Step 5 above is a step of permanently adhering an adherend and the silicone-based adhesive sheet described above, and individual pieces of the semiconductor wafer are adhered onto the semiconductor base material by the silicone-based adhesive sheet by a post-curing operation of heating within a range of 50 to 200° C. In this case, heating conditions and the like are as described above. Note that step 5 can simultaneously process a structure in which many individual pieces of the semiconductor wafer are arranged on the semiconductor base material by the silicone-based adhesive sheet surface, and therefore has excellent industrial production efficiency and can easily mass-produce even fine and high-precision semiconductor devices such as MEMS devices. Note that in addition to heat treatment, irradiation with a high energy beam such as ultraviolet light or the like may also be used in combination in step 5.

The method of manufacturing a semiconductor device of the present invention is provided with steps 1 to 5 above. Needless to say, the method may include, if desired, a protective film formation step for the wafer, a wiring step for the semiconductor base material, a chip and electrode connection step, a polishing step, a partial or total sealing step, or the like at any desired timing.

The silicone-based adhesive sheet forming the integrated dicing die bonding sheet of the present invention has advantages of a certain elastomeric property (flexibility) when used as a permanent adhesive layer, and the thickness of the adhesive sheet not changing significantly before and after the permanent adhesion step in step 5. Therefore, there is an advantage of providing excellent shock and stress relaxation for semiconductor chips (dies) mounted on a semiconductor base material, improving the production efficiency of fine, high-precision semiconductor devices such as MEMS devices, as well as improving the reliability and yields thereof.

A semiconductor member of the semiconductor wafer or semiconductor chip described above can be individualized using known means such as dicing or the like using the integrated dicing die bonding sheet of the present invention, and arranged (mounted) on an attachment part on the semiconductor base material such as a die pad or the like as a semiconductor chip (die) provided with the silicone-based adhesive sheet of the present invention. Furthermore, the surface of the silicone-based adhesive sheet of the attachment part has the slight pressure-sensitive adhesion described above; therefore, the semiconductor chip (die) can easily be temporarily secured on the semiconductor base material with only a very short pressure bonding time or physical installation. Moreover, there is an advantage in which misalignment or peeling are less likely to occur with regard to vibrations and the like.

The material and the like of the semiconductor base material is not particularly limited, but may be an essentially flat plate. Furthermore, although not particularly limited, examples of the material thereof include semiconductor chips, aluminum, iron, zinc, copper, magnesium alloys, and other metals, ceramics, glass, epoxy resins, polyimide resins, phenol resins, Bakelite resins, melamine resins, glass fiber reinforced epoxy resin, acrylic resin, ABS, SPS and other plastics, and glass. While not particularly limited thereto, the thickness of the base material may be 0.1 to 10 mm. Note that these are non-pressure-sensitive adhesive base materials that do not have pressure-sensitive adhesive properties on their own.

A semiconductor device (suitably, a MEMS device) having a structure in which a semiconductor chip or a semiconductor wafer is fixed on a base material can be obtained by Steps 1 to 5. The semiconductor device (especially MEMS device, or the like) may further be provided with circuit wiring, bonding wires or bumps for connecting chips and circuit wiring, resin layers that encapsulate a portion or all of the circuit wiring or chips, and the like, and can be suitably designed according to the type or application of the semiconductor device. Furthermore, the semiconductor device may have a horizontally arranged structure, a vertically arranged structure, or a three-dimensionally stacked structure. Note that the silicone-based adhesive sheet containing the integrated dicing die bonding sheet of the present invention has a slightly pressure-sensitive adhesive surface, which enables temporary fixing and repositioning even in arrangements other than the horizontal direction, and once temporarily fixed to the designed attachment site, the sheet is resistant to misalignment even when subjected to shocks and vibrations associated with other wiring and the like, and can easily be permanently adhered to a chip, or the like, by heating the semiconductor device precursor as is, thus providing a benefit of being flexibly adaptable to various semiconductor device designs and manufacturing processes.

EXAMPLES

The integrated dicing die bonding sheet according to the present invention, the silicone-based adhesive sheet used therein, the manufacturing method thereof, and the semiconductor device will be described in detail using examples and comparative examples, but the present invention is not limited thereto.

Examples 1 to 5 and Comparative Examples 1 to 3

The present invention will be described below by way of examples; however, the present invention is not limited thereto. In Examples 1 to 5 and Comparative Examples 1 to 3 shown below, the following compounds or compositions were used as raw materials. Note that each viscosity is a value measured at 25° C.

[Components of Curable Organopolysiloxane Composition]

(A1) Dimethylpolysiloxane blocked with dimethylvinylsiloxy groups at both ends of a molecular chain having a viscosity of 2,000 mPa·s (amount of vinyl groups=0.23 weight %)

(A2) Dimethylpolysiloxane blocked with dimethylvinylsiloxy groups at both ends of a molecular chain having a viscosity of 40,000 mPa·s (amount of vinyl groups=0.08 weight %)

(A3) Silicone resin polysiloxane mixture containing 70 weight % of a dimethylpolysiloxane blocked with dimethylvinylsiloxy groups at both ends of a molecular chain with a viscosity of 2,000 mPa·s (amount of vinyl groups=0.23 weight % and 30 weight % of an organopolysiloxane containing an $SiO_{4/2}$ unit, $(CH_3)_3SiO_{1/2}$ unit, and $(CH_3)_2(CH_2{=}CH)SiO_{1/2}$ unit (amount of vinyl groups=2.5 weight %)

(A4) Silicone resin polysiloxane mixture containing 30 parts by weight of a dimethylpolysiloxane blocked with dimethylvinylsiloxy groups at both ends of a molecular chain with a viscosity of 80 mPa·s (amount of vinyl groups=1.50 weight % and 70 parts by weight of an organopolysiloxane containing an $SiO_{4/2}$ unit, $(CH_3)_3SiO_{1/2}$ unit, and $(CH_3)_2(CH_2{=}CH)SiO_{1/2}$ unit (amount of vinyl groups=3.0 weight %)

(B1) Copolymer of methylhydrogensiloxane/dimethylsiloxane blocked with trimethylsiloxy groups at both ends of a molecular chain with a viscosity of 60 mPa·s (amount of silicon atom-bonded hydrogen atoms=0.7 weight %)

(B2) Copolymer of methylhydrogensiloxane/dimethylsiloxane blocked with trimethylsiloxy groups at both ends of a molecular chain with a viscosity of 5 mPa·s (amount of silicon atom-bonded hydrogen atoms=0.74 weight %)

(B3) Methylhydrogenpolysiloxane blocked with trimethylsiloxy groups at both ends of a molecular chain having a viscosity of 23 mPa·s (amount of silicon atom-bonded hydrogen atoms=1.55 weight %)

(B4) Organopolysiloxane resin with a viscosity of 25 mPa·s, containing an $SiO_{4/2}$ unit and $H(CH_3)_2SiO_{1/2}$ unit (amount of silicon atom-bonded hydrogen atoms=0.97 weight %)

(C1) Adhesion imparting agent, which is a condensation reaction product of 3-glycidoxypropyl trimethoxysilane and a dimethylsiloxane-methylvinylsiloxane copolymer blocked with hydroxyl groups at both ends of a molecular chain at a mass ratio of 1:1, with a viscosity of 30 mPa·s (C2) Carbasilatrane derivative expressed by the following structural formula:

[Formula 4]

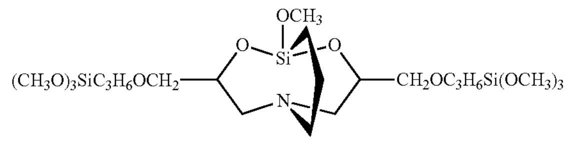

(D) Complex of platinum and 1,3-divinyl-1,1,3,3-tetramethyldisiloxane with a platinum concentration of 0.6 weight %

The following components (E) as a reaction control agent:

(E1) Phenylbutynol (E2) Ethynylcyclohexanol (E3) 1,3,5,7-tetramethyl-1,3,5,7-tetravinylcyclotetrasiloxane (F) Treated fumed silica obtained by treating fumed silica of 200 $m^2/g$ with hexamethyldisalazane Compositions and sheets pertaining to the silicone-based adhesive sheet were prepared by the following methods. Furthermore, the hardness, adhesion, surface condition, and the like of the obtained sheets were measured or evaluated as follows.

[Preparation of Curable Organopolysiloxane Composition and Silicone-Based Adhesive Sheet]

Each of the above components except for component (D) was mixed uniformly at the weight ratio (parts by weight) listed below in Table 1, and Component (D) was mixed last at the weight ratio (parts by weight) listed in Table 1. The composition was de-foamed in a vacuum, sandwiched between 50 μm thick polyethersulfone resin films, adjusted to a predetermined thickness using two stainless steel rollers with adjusted clearance, and heated in a convection oven at 100° C. for 30 minutes to cause cross-linking in the composition. Thereby the silicone-based adhesive sheets of Examples 1 to 5 and Comparative Examples 1 and 2 were obtained. Furthermore, Comparative Example 2 had the same composition as Example 1, except that a fluorine-based release film was used instead of a polyethersulfone film. Comparative Example 3 had the same composition as Example 2, but the curing conditions were changed to 85° C. for 3 minutes to make a semi-cured product (B-stage product).

[Hardness of Silicone-Based Adhesive Sheet]

The hardness of the silicone-based adhesive sheet in the examples and comparative examples was measured using a JIS-A hardness tester after the compositions were mixed and vacuum degassed, 2 mm thick sheets were formed in a mold, and three sheets were overlaid to be 6 mm thick. For Comparative Example 1, a Shore-D hardness tester was used. The results are shown in Table 1. Comparative Example 3 was not measurable because it was semi-cured and gelatinous.

[Surface Tackiness of Silicone-Based Adhesive Sheet]

A silicone-based adhesive sheet (20 mm×20 mm) was affixed to glass (25 mm×75 mm) using double-sided tape for silicone (Nitto Denko 5302A) to create a test piece. An 8 mm diameter stainless steel probe of a texture analyzer (model number TAXTplus, manufactured by Eko Instruments) was lowered against the sheet surface at a rate of 0.01 mm/s, held for 0.5 seconds after reaching an applied load of 50 gf, and then the probe was raised at a rate of 0.5 mm/s. The stress applied to the probe during ascent was measured. Tests where a maximum value was obtained during the measurement were evaluated as Maximum value present, and tests where a maximum value was not obtained were evaluated as Maximum value absent, and the maximum value obtained during testing was defined as the tackiness (gf). Note that in all cases of silicone adhesive sheets with a maximum value present, the adhesive sheet peeled from the probe at the interface, and there was no adhesive residue or the like due to the cohesive failure of the adhesive layer.

[Adhesion Expression of Silicone-Based Adhesive Sheet After Dicing Tape Lamination]

The adhesive properties of the silicone-based adhesive sheet in the examples and comparative examples after laminating the dicing tape were evaluated by the following methods, and the results are shown in Table 1.

The polyethersulfone film on one side, which is a liner of the silicone-based adhesive sheet, is peeled off (fluorine-based release film in Comparative Example 2) and laminated to a commercially available dicing tape, Adwill D-650. The laminate body was left at 25° C. and 55% RH for 7 days. The polyethersulfone film on the side opposite the dicing tape was then peeled off and attached to a 188 μm thick PET film using double-sided tape with silicone-based pressure-sensitive adhesive, and the dicing tape was peeled off to expose the dicing tape contact surface of the silicone-based adhesive sheet. A 5 mm square silicon chip was placed on the sheet and heated with a load of 20 kgf for 10 seconds at 150° C. using a die attach press.

<Evaluation Results of Adhesion Expression>

After cooling at room temperature, the silicon chip was peeled off using tweezers. Examples 1 to 5, which were not easily peeled off by rubbing with the tip of the tweezers were evaluated as OK. Comparative Example 1 did not adhere because the film was too hard to closely follow the contour (NG1). Comparative Example 2 did not develop adhesion on the surface after curing because a fluorine-based release film was used as the liner (NG2). Furthermore, Comparative Example 3 was "unmeasurable" because it adhered to the dicing tape and could not be peeled off.

[Changes in Thickness Before and After Heating]

The thickness before heating was measured by measuring the thickness of the three layers after heating between the two liners at 100° C. for 30 minutes (85° C. for 3 minutes for Comparative Example 3) and subtracting the thickness of the liners on both sides. In the adhesion expression test, the silicon chip was placed, and then heated under a load of 20 kgf for 10 seconds at 150° C. using a die attach press.

<Evaluation Results of Changes in Thickness>

With the exception of Comparative Example 3 which could not be peeled off due to adhesion to the dicing tape (impossible to measure), Examples 1 to 5 and Comparative Examples 1 to 2 were evaluated as "OK" because the crosslinking reaction was sufficiently completed by heating at 100° C. for 30 minutes between the liners, and the change in thickness before and after heating load was within 10%.

TABLE 1

| | Example 1 | Example 2 | Example 3 | Example 4 | Example 5 | Comparative Example 1 | Comparative Example 2 | Comparative Example 3 |
|---|---|---|---|---|---|---|---|---|
| A1 | | 4.4 | 91 | 91 | 91 | | | 91 |
| A2 | 77.1 | 86.2 | | | | | 77.1 | |
| A3 | 19.2 | | | | | | 19.2 | |
| A4 | | | | | | 80.5 | | |
| F | 9.5 | 13 | 16.2 | 16.2 | 16.2 | | 9.5 | 16.2 |
| C1 | 1.3 | 1.6 | 0.5 | 0.5 | 0.5 | 1 | 1.3 | 0.5 |
| C2 | | 0.8 | | 0.2 | 0.5 | | | |
| B1 | | 3.8 | 2.1 | 2.1 | 2.1 | | | 2.1 |
| B2 | 2.7 | | | | | | 2.7 | |
| B3 | | | | | | 4.4 | | |
| B4 | | | | | | 9.3 | | |
| E1 | | 0 | 0.01 | 0.01 | 0.01 | | | 0.01 |
| E2 | | | | | | 0.1 | | |
| E3 | | | | | | 4.5 | | |
| D | 0.2 | 0.2 | 0.2 | 0.2 | 0.2 | 0.2 | 0.2 | 0.2 |
| Total (parts by weight) | 109.8 | 109.8 | 109.81 | 110.01 | 110.31 | 99.8 | 109.8 | 109.81 |
| H/Vi | 1.6 | 3.1 | 1.6 | 1.5 | 1.4 | 1.2 | 1.6 | 1.6 |
| Curing conditions | 100 C./ 30 min. | 100 C./ 30 min. | 100 C./ 30 min. | 100 C./ 30 min. | 100 C./ 30 min. | 130 C./ 60 min. | 100 C./ 30 min. | 85 C./ 3 min. |
| JIS-A hardness | A35 | A32 | A40 | A40 | A40 | D55 | A35 | Unmeasurable |
| Presence or absence of maximum tackiness test value | | Present | Present | | | None | | |
| Tackiness (gf) | | 211 | 199 | | | 0.2 | | |
| Adhesion expression | OK | OK | OK | OK | OK | NG 1 | NG 2 | Unmeasurable |
| Thickness before heating (μm) | 175 | 80 | 25 | 75 | 75 | 20 | 50 | 75 |
| Thickness change (OK/NG) | OK | OK | OK | OK | OK | OK | OK | Unmeasurable |

[Confirmation of Dicing Properties]

An integrated dicing die bonding sheet was made using the silicone adhesive sheet in Example 3, and dicing was tested under the following conditions. Note that the silicone adhesive sheet for other examples can also be similarly used for dicing.

Substrate: 550 μm thick silicon dummy wafer

Die size after cutting: 1 mm×1 mm

Dicing Tape Adwill D-650 (88 μmT)

Dicing blade abrasive grain: #3,000

Blade thickness: 70 μm

Blade rotational speed: 30,000 rpm

Cutting speed: 10 mm/s

<Evaluation Results of Dicing Properties>

Figure 2:
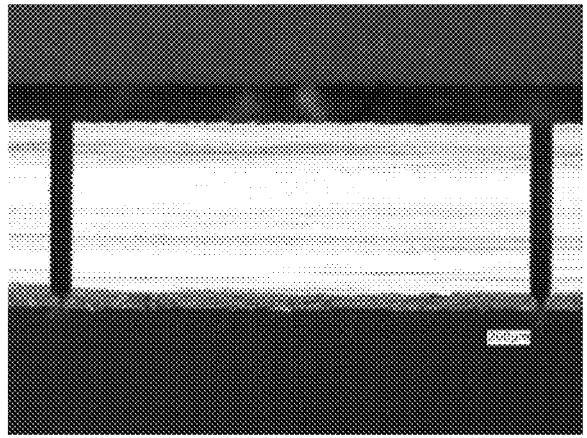
FIG. 2 is a photograph of a semiconductor wafer diced using an integrated dicing die bonding sheet of the Examples, observed from a side surface.

Results: Chip flying: 0%, Chipping: OK, Cracking: 0%, so dicing was performed without problems. Photographs of the resulting wafers after dicing, taken from the top and side surfaces, are depicted in FIG. 1 and FIG. 2 (FIG. 1: Photograph observed from the upper surface. FIG. 2: Photograph observed from the side surface).

[Summary]

As shown by the test results of Examples 1 to 5 and Comparative Examples 1 to 3, silicone-based adhesive sheets that cure between specific liners and have a JISA hardness of 32 to 40 have sufficient storage stability after lamination to a commercially available dicing tape, and can easily peel off from the acrylic pressure-sensitive adhesive layer of the dicing tape at the interface. After being laminated with commercial dicing tape, the silicone-based adhesive sheet has sufficient storage stability and can be easily interfacially peeled from the acrylic pressure-sensitive adhesive layer of the dicing tape. Furthermore, the thickness of the adhesive layer of the silicone-based adhesive sheet is stable and did not change significantly after heating and loading because the crosslinking reaction was sufficiently completed. The sheet had excellent dicing performance, and had properties for suppressing chip flying, chipping, cracking, and the like during dicing. Therefore, the integrated dicing die bonding sheet is expected to be extremely useful in the dicing and die bonding process of semiconductor wafers.

The invention claimed is:

1. An integrated dicing die bonding sheet adhered to a semiconductor wafer, the integrated dicing die bonding sheet comprising:

a base film; and a silicone-based adhesive sheet having an adhesive surface adhered to the semiconductor wafer;

wherein when maintained to a temperature below 50° C., the base film includes a property of being interfacially peelable from the silicone-based adhesive sheet, and wherein subjecting an adhesive surface of the silicone-based adhesive sheet to a temperature within a range of 50° C. to 200° C., changes a peeling property of the adhesive surface from a non-pressure-sensitive adhesive base material to cohesive failure, exhibiting permanent adhesion.

2. The integrated dicing die bonding sheet according to claim 1, wherein the adhesive surface of the silicone-based adhesive sheet is configured to be disposed on the non-pressure-sensitive adhesive base material, and configured to be heated within a range of 50° C. to 200° C. such that the semiconductor wafer and the non-pressure-sensitive adhesive base material are permanently adhered to each other via the silicone-based adhesive sheet.

3. The integrated dicing die bonding sheet according to claim 1, wherein the silicone-based adhesive sheet is a crosslinked product of a crosslinkable silicone composition comprising:

(A) an organopolysiloxane having at least two silicon atom-bonded alkenyl groups in a molecule;

(B) an organopolysiloxane having at least two silicon atom-bonded hydrogen atoms in one molecule;

(C) at least one type of adhesion promoter; and (D) a hydrosilylation reaction catalyst; wherein, relative to one mol of the silicon atom-bonded alkenyl groups in component (A), the amount of the silicon atom-bonded hydrogen atoms in the component is within a range of 1.0 to 3.0 mols, and the amount of component (C) is within a range of 0.1 to 5.0 parts by mass relative to 100 parts by mass of component (A), and in a state of maintaining a temperature below 50° C., the adhesive sheet surface is a pressure-sensitive adhesive, which provides pressure-sensitive adhesive properties that enable interfacial peeling from the base film.

4. The integrated dicing die bonding sheet according to claim 3, wherein component (C) is at least one type of adhesion promoter selected from a group consisting of:

(C1) siloxanes having at least one each of a silicon atom-bonded alkenyl group or a silicon atom-bonded hydrogen atom and a silicon atom-bonded alkoxy group in one molecule;

(C2) an organosiloxane having at least one each of a silicon atom-bonded alkenyl group, silicon atom-bonded alkoxy group, and silicon atom-bonded epoxy-containing monovalent organic group in one molecule;

(C3) a mixture or reaction mixture of a silane or siloxane having at least one silicon atom-bonded alkoxy group in one molecule and an organosiloxane having at least one each of a silicon atom-bonded hydroxy group and silicon atom-bonded alkenyl group in one molecule; and (C4) a mixture or reaction mixture of an organosilane or organosiloxane having at least one each of a silicon atom-bonded alkoxy group and silicon atom-bonded epoxy group-containing monovalent organic group in one molecule and an organosiloxane having at least one each of a silicon atom-bonded hydroxy group and silicon atom-bonded alkenyl group in one molecule.

5. The integrated dicing die bonding sheet according to claim 3, wherein the silicone-based adhesive sheet is a crosslinked product of a crosslinkable silicone composition, which is obtained by crosslinking the composition between base materials that have releasability with respect to the crosslinked product, and at least one of the base materials has an oxygen atom or sulfur atom on a contact surface with the composition.

6. The integrated dicing die bonding sheet according to claim 1, wherein the base film is a resin film having elasticity in length and width directions of the film.

7. The integrated dicing die bonding sheet according to claim 1, wherein a texture analyzer is used to lower a stainless steel probe with a diameter of 8 mm onto any surface of the silicone-based adhesive sheet at a rate of 0.01 mm/second with respect to the sheet surface, and apply a load of 50 gf, which was maintained for 0.5 seconds, and then, after raising the probe at a rate of 0.5 mm/second, the adhesive sheet was interfacially peeled from the probe; and wherein a surface of the silicone-based adhesive sheet comprises a maximum adhesive strength value resulting from heating for three hours within a range of 100 to 200° C., the peeling property from the non-pressure-sensitive adhesive base material of the adhesive surface configured to change to cohesive failure, exhibiting permanent adhesion.

8. The integrated dicing die bonding sheet according to claim 1, configured to adhere a semiconductor chip or semiconductor wafer individualized by dicing to an attachment part thereof.

9. The integrated dicing die bonding sheet according to claim 1, configured for manufacturing a micro electro mechanical systems (MEMS) device.

10. A method of manufacturing a semiconductor device, comprising the following steps:

1) Exposing the silicone-based adhesive sheet surface of the integrated dicing die bonding sheet according to claim 1 on a side not adhered to a base film and then laminating to a rear surface of a semiconductor wafer;

2) Individualizing the laminate body obtained in step 1) by dicing;

3) Interfacially peeling the base film from an individual piece of the semiconductor wafer obtained in step 2) to expose the silicone-based adhesive sheet surface on the base film side;

4) Arranging the individualized semiconductor wafer on a semiconductor base material via the silicone-based adhesive sheet surface exposed in step 3); and 5) Heating the structure with the individual piece of the semiconductor wafer arranged on the semiconductor base material by the silicone-based adhesive sheet surface, which was obtained in step 4), within a range of 50 to 200° C. to adhere the individual piece of the semiconductor wafer on the semiconductor base material by the silicone-based adhesive sheet.

11. The method of manufacturing a semiconductor device according to claim 10, wherein the semiconductor device is a micro electro mechanical systems (MEMS) device.

* * * * *